United States Patent [19]

Koen

[11] Patent Number: 4,458,201

[45] Date of Patent: Jul. 3, 1984

[54] DIGITALLY CONTROLLED PRECISION CURRENT SOURCE WITH AN OPEN LOOP COMPENSATION CIRCUIT

[75] Inventor: Myron J. Koen, Tucson, Ariz.

[73] Assignee: Burr-Brown Research Corp., Tucson, Ariz.

[21] Appl. No.: 365,194

[22] Filed: Apr. 5, 1982

[51] Int. Cl.³ .......................... G05F 3/20; G05F 1/58
[52] U.S. Cl. ................................. 323/317; 323/314; 323/354; 340/347 DA
[58] Field of Search ............................ 323/271–272, 323/297, 350–351, 352–354, 312–317; 307/296 R, 297; 340/347 DA, 347 AD, 347 CC

[56] References Cited

U.S. PATENT DOCUMENTS

| | | | |
|---|---|---|---|
| 3,721,893 | 3/1973 | Davis | 323/317 |
| 3,731,181 | 5/1973 | Cecil et al. | 323/354 X |
| 3,961,326 | 6/1976 | Craven | 340/347 DA |
| 4,056,740 | 11/1977 | Schoeff | 340/347 DA |
| 4,400,690 | 8/1983 | Brokaw et al. | 340/347 DA |

Primary Examiner—Peter S. Wong
Attorney, Agent, or Firm—Cahill, Sutton & Thomas

[57] ABSTRACT

A precision current source includes a current source transistor and a current steering circuit which selectively directs the output current from the current source transistor through either a first or a second current path in response to a digital input signal. A compensation circuit directs a highly accurate steady state current through first and second series coupled compensation transistors. The base of the second compensation transistor is coupled to the base of the current source transistor. The compensation circuit operates to control the voltage differential between the base of the current source transistor and a voltage source to maintain the output current intermittently steered through the second current path precisely constant regardless of changes in the beta of the current switching transistor or changes in the beta or base to emitter voltage of the current source transistor.

7 Claims, 6 Drawing Figures

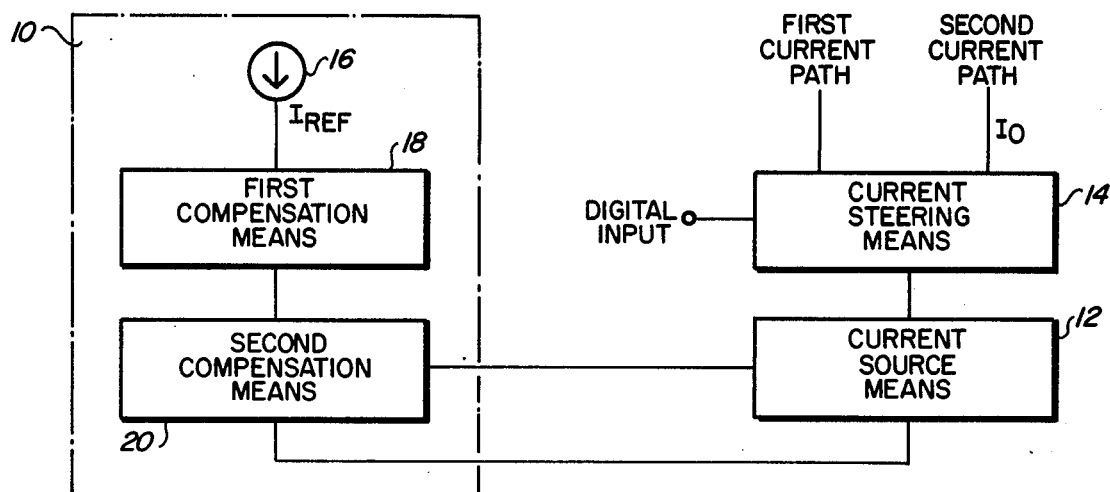
Fig-1
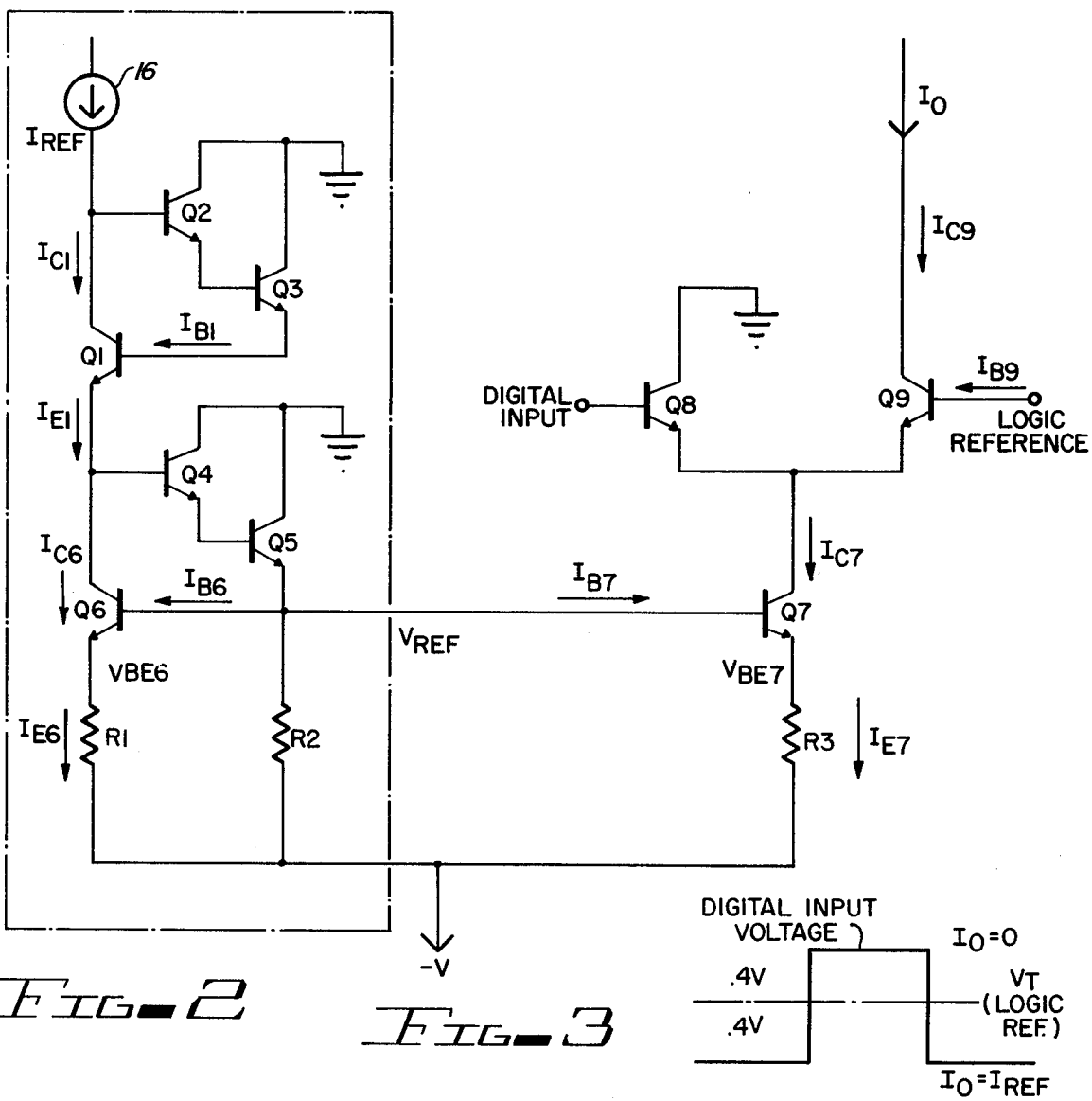
Fig-2
Fig-3

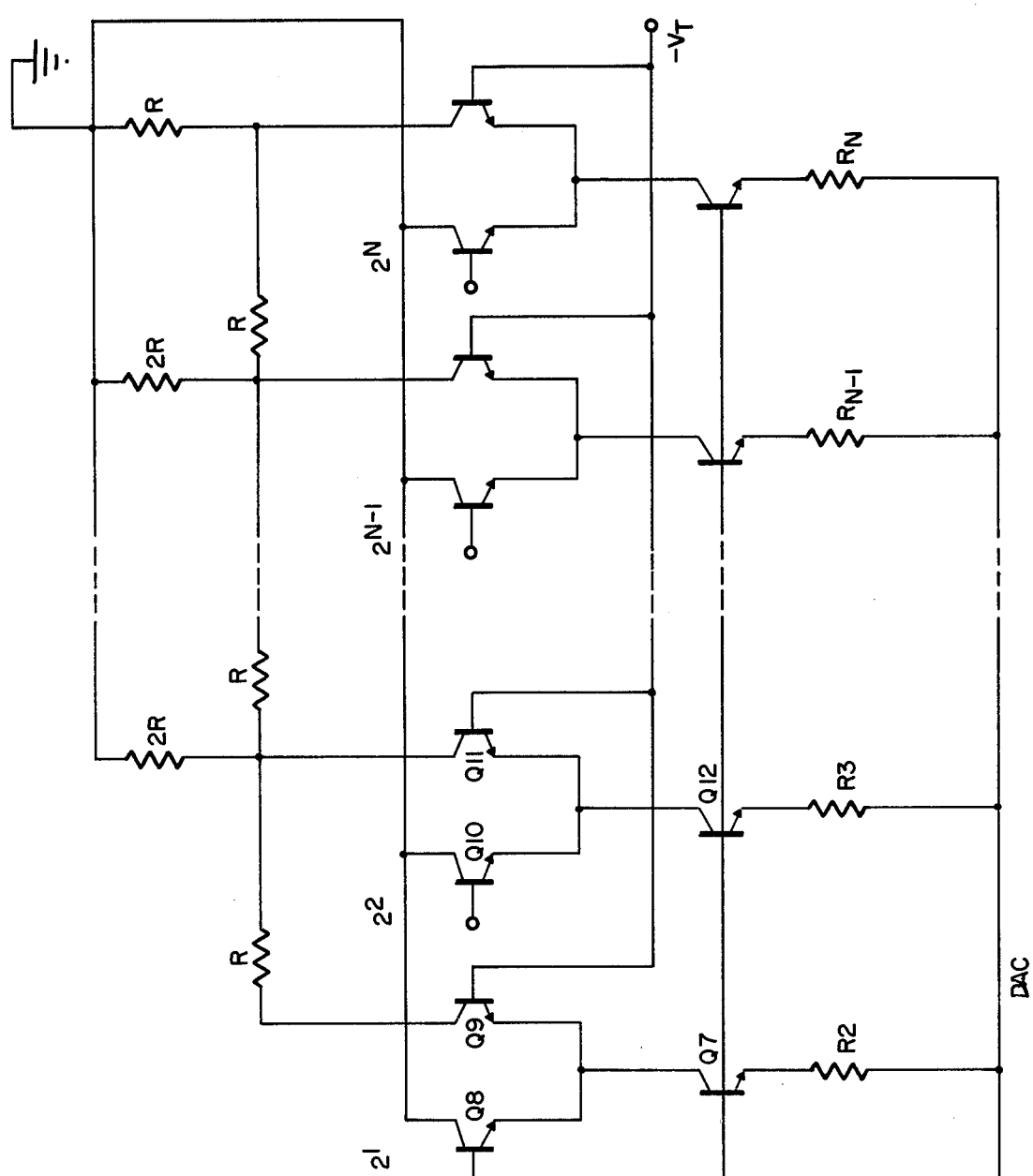
FIG-4
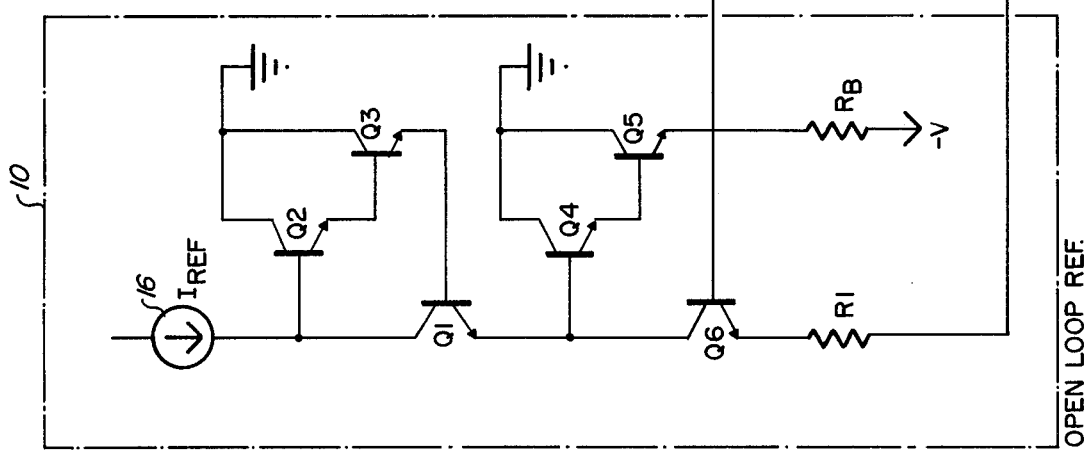

DIGITALLY CONTROLLED PRECISION CURRENT SOURCE WITH AN OPEN LOOP COMPENSATION CIRCUIT

BACKGROUND OF THE INVENTION

1. Field of the Invention

This invention relates to precision, high speed current sources which intermittently direct an output current into a selected current output path in response to a digital input signal. Such a current source may be utilized in many applications including precision digital to analog converters.

2. Description of the Prior Art

Digitally controlled precision current sources are commonly utilized in high speed current summing digital to analog converters. In order to prevent variations in output current caused by variations in transistor beta and base to emitter voltage ($V_{BE}$), an operational amplifier and a transistor are commonly coupled together to form a feedback loop compensation circuit capable of controlling the current source transistor to maintain the current source transistor output current constant as beta and $V_{BE}$ vary. Those skilled in the art know that the beta and base-to-emitter voltage parameters of a bipolar transistor vary substantially with the temperature of the transistor and also vary substantially with certain manufacturing process parameters. Those skilled in the art also know that the beta and base-to-emitter voltage of a transistor also vary somewhat with variations in the collector to base voltage of the transistor in the linear and almost-linear portions of its $I_C$ versus $V_{CE}$ operating characteristic. A discrete component version of a feedback controlled digital to analog converter of this type is disclosed in U.S. Pat. No. 3,685,045 and U.S. Pat. No. Re. 28,619 (Pastoriza). A monolithic version of a feedback controlled digital to analog converter is disclosed in U.S. Pat. No. Re. 28,633; U.S. Pat. Nos. 3,978,473; and 4,020,486 (Pastoriza).

Feedback controlled constant current sources of the type disclosed in the Pastoriza patents listed above correct comparatively slowly for variations in output current and require that discrete capacitors be coupled to the operational amplifier to prevent instability in the high gain feedback loop. In addition, the requirement of the Pastoriza circuits for an operational amplifier and discrete capacitors tends to make this closed loop feedback compensation system comparatively costly in terms of the cost ratio of the compensation circuit to the digital to analog converter circuitry.

SUMMARY OF THE INVENTION

It is therefore a primary object of the present invention to provide a digitally controlled precision current source including a high speed open loop compensation circuit which can be fabricated on a single monolithic substrate.

Another object of the present invention is to provide a digitally controlled precision current source which generates a steerable output current which does not vary with changes in transistor beta or $V_{BE}$.

Yet another object of the present invention is to provide a digitally controlled precision current source which utilizes an open loop compensation circuit having extremely fast transient response.

Still another object of the present invention is to provide a digitally controlled precision current source which utilizes only resistors and transistors and is inexpensive to fabricate.

Yet another object of the present invention is to provide a digitally controlled precision current source which can be coupled together in repetitive groups to form a digital to analog converter.

Briefly stated, and in accord with one embodiment of the invention, a digitally controlled precision current source generates a precision output current which is steerable through either a first or a second current path in response to a digital input signal. A current source generates a substantially constant output current and includes a current source transistor having an emitter coupled to a voltage source. A current steering circuit selectively directs the output current from the current source through either the first or the second current path in response to the digital input signal. The current steering circuit includes a switching transistor having an emitter which is coupled to the collector of the current source transistor and a collector which is coupled to the second current path. A compensation circuit includes a reference current source which generates a steady state highly accurate reference current. The compensation circuit also includes first and second compensation circuits. The first compensation circuit includes a first transistor which receives the steady state reference current and generates a first compensated output current to correct for the beta error of the switching transistor. The second compensation circuit includes a second transistor which receives the first compensated output current. The base of the second transistor is coupled to the base of the current source transistor while the emitter of the second transistor is coupled to a voltage source. The second compensation circuit corrects for the beta error and base to emitter voltage error of the current source transistor. The compensation circuit varies the voltage differential between the base of the current source transistor and the voltage source to maintain the digitally controlled output current which is intermittently steered through the second current path precisely constant regardless of changes in the beta or base to emitter voltage of the current switching transistor or the current source transistor.

DECRIPTION OF THE DRAWINGS

The invention is pointed out with particularity in the appended claims. However, other objects and advantages together with the operation of the invention may be better understood by reference to the following detailed description taken in connection with the following illustrations, wherein:

FIG. 1 is a block diagram representation of the primary circuit elements of the digitally controlled precision current source.

FIG. 2 is a schematic diagram illustrating a digitally controlled precision current source capable of generating a single switched precision output current.

FIG. 3 illustrates the effect of the digital input signal on the output current generated by the digitally controlled precision current source.

FIG. 4 is a schematic diagram illustrating a digital to analog converter fabricated from a plurality of digitally controlled precision current sources having a single compensation circuit.

DESCRIPTION OF THE PREFERRED EMBODIMENT

Figure 5:
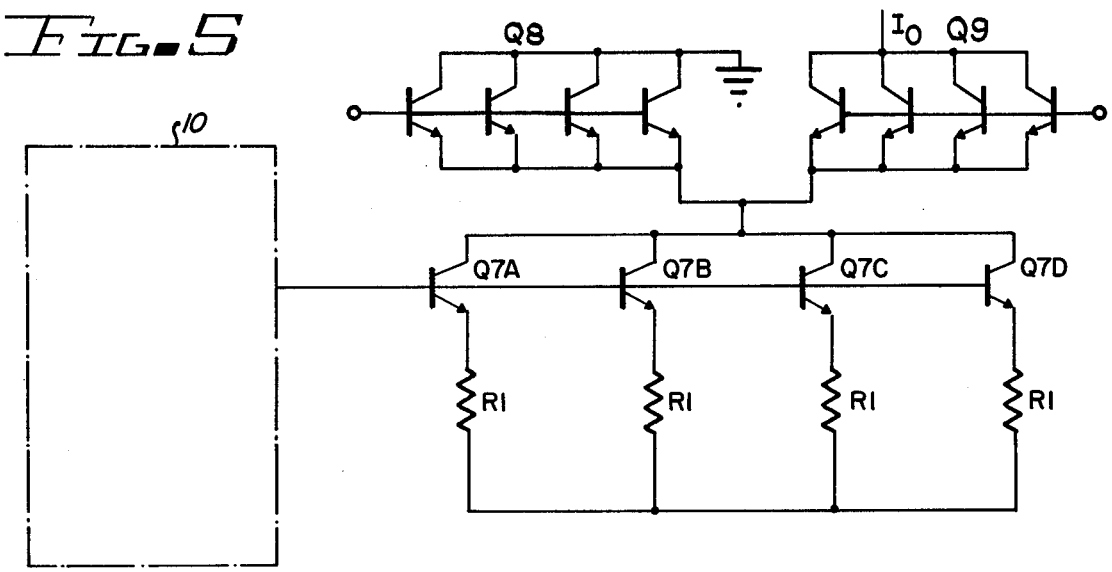
FIG. 5 is a partial schematic diagram depicting a digitally controlled precision current source which utilizes a current source having a plurality of parallel coupled transistors.

In order to better illustrate the advantages of the invention and its contributions to the art, a preferred hardware embodiment of the invention will now be described in detail.

Referring to FIGS. 1 and 2, the digitally controlled precision current source of the present invention includes a compensation circuit 10 which corrects for errors produced by current source 12 and current steering circuit 14.

Compensation circuit 10 includes a current source 16 that generates an output current $I_{ref}$. $I_{ref}$ is a DC or steady state current which can easily be maintained at a fixed magnitude with a high degree of precision. A current source of this type can be implemented in a variety of ways well known to one of ordinary skill in the art. Current source 16 may be fabricated by utilizing either PNP or NPN transistors on a monolithic substrate which includes all of the remaining elements of the digitally controlled precision current source.

The reference current output from current source 16 is coupled to first compensation means 8 which includes transistors $Q_1$, $Q_2$ and $Q_3$. The Darlington connection of $Q_2$ and $Q_3$ biases $Q_1$ into a linear operating region where $Q_1$ is relatively insensitive to errors and isolates the base of $Q_1$ from its collector. The Darlington biasing circuit supplies base current to $Q_1$ from the circuit power supply and does not divert a significant amount of $I_{ref}$ from the collector of $Q_1$. Since the base current drawn by $Q_2$ is negligible, $I_{ref}$ is essentially equal to the collector current $I_{C1}$ of $Q_1$. In certain applications, it may be possible to utilize a single transistor to provide bias for $Q_1$ although more accurate circuit performance can be achieved by utilization of the Darlington coupled pair of transistors as illustrated. $Q_1$, $Q_2$, $Q_3$ which form first compensation means 18 corrects for the beta error attributable to $Q_9$ as will be explained below.

The emitter current produced by $Q_1$ enters the node formed by the emitter of $Q_1$, the base of $Q_4$ and the collector of $Q_6$. Darlington coupled transistors $Q_4$ and $Q_5$ bias in the same way that $Q_2$ and $Q_3$ bias $Q_1$. Since the base current drawn by $Q_4$ is negligible, the $Q_1$ emitter current $I_{E1}$ is essentially equal to the collector current $I_{C6}$ of $Q_6$. Transistors $Q_4$, $Q_5$ and $Q_6$ together with load resistor $R_1$ and biasing resistor $R_2$ form second compensation means 20.

The base terminal of $Q_6$ is coupled to the base terminal of $Q_7$ which is FIG. 1 is designated as current source means 12. A load resistor $R_3$ is coupled between the emitter of $Q_7$ and the negative power supply terminal $-V$. Typically resistor $R_1$ is equal in value to resistor $R_3$.

The collector of current source transistor $Q_7$ is coupled to current steering means 14. In the preferred embodiment of the invention, current steering means 14 is formed by current steering transistors $Q_8$ and $Q_9$. $Q_8$ serves as a buffer transistor which provides an interface between the digital input terminal and switching transistor $Q_9$. The collector terminal of $Q_8$ is coupled to ground which provides a current return path or first current path while the collector terminal of switching transistor $Q_9$ is coupled by a second current path to an output such as a resistive load. The output of steering means 14 is designated as $I_0$.

Referring now also to FIG. 3, if the base of $Q_8$ is approximately 400 mV more positive than the $V_T$ logic reference voltage applied to the base of $Q_9$, the collector current of $Q_7$ is steered to ground through $Q_8$ and the first current path. For this digital input condition, the circuit output current $I_0$ is equal to 0 mA. If the base of $Q_8$ is switched to a level approximately 400 mV more negative than the base of $Q_9$, the collector current of $Q_7$ is steered to the circuit output through $Q_9$ and the second current path. For this digital input condition, the circuit output current $I_0$ is precisely equal to $I_{ref}$, the precision current generated by current source 16.

In an equivalent embodiment of the present invention, current steering means 14 can be configured to accept a complementary digital input signal which is simultaneously applied to the base terminals of $Q_8$ and $Q_9$.

Since in the preferred embodiment of the invention extremely fast frequency response is desired, $Q_1$–$Q_9$ are illustrated as NPN transistors. In addition, since each of these transistors is fabricated on a single monolithic substrate, transistor parameters such as beta and $V_{BE}$ are precisely matched which is required for proper high precision and high speed operation of this circuit.

Compensation circuit 10 is designed to correct for beta errors produced by $Q_9$ and for both beta and $V_{BE}$ errors produced by current source transistor $Q_7$. $Q_7$ functions as a comparatively high quality current source such that variations in the $Q_7$ collector voltage caused by changes in $Q_9$ $V_{BE}$ have virtually no effect on the collector current produced by $Q_7$. For this reason, compensation circuit 10 is not required to compensate for $Q_9$ $V_{BE}$ errors. First compensation means 18 formed by $Q_1$, $Q_2$ and $Q_3$ effectively compensates for variations in $Q_9$ beta.

Since the circuit output current $I_0$ will vary if either the beta or $V_{BE}$ of $Q_7$ varies without compensation, second compensation means 20 which includes transistor $Q_4$, $Q_5$ and $Q_6$ and resistors $R_1$ and $R_2$ compensates for both beta and $V_{BE}$ errors of $Q_7$.

In order to demonstrate the manner in which compensation circuit 10 corrects for the beta error of $Q_9$ and both the beta and $V_{BE}$ errors of $Q_7$, a mathematical current analysis will be accomplished to demonstrate that the circuit output current $I_0$ is absolutely independent of the beta and $V_{BE}$ errors discussed above. For this mathematical analysis, we assume first that:

$$I_{ref} = I_{C1} \quad (1)$$

This assumption can be made since the beta of transistors $Q_1$, $Q_2$ and $Q_3$ is comparatively high (typically greater than 100) and the base current drawn by $Q_2$ is therefore negligible.

The emitter current $I_{E2}$ produced by $Q_1$ can be determined as follows:

$$I_{E1} = I_{C1} + I_{B1} \quad (2)$$
$$= I_{C1} + I_{C1}/\beta_1$$
$$= I_{C1}\left(\frac{\beta_1 + 1}{\beta_1}\right)$$

$$= I_{ref}\left(\frac{\beta_1 + 1}{\beta_1}\right)$$

For the same reasons that permitted the assumption that $I_{ref}=I_{C1}$, we assume that:

$$I_{E1}=I_{C6} \quad (3)$$

Therefore:

$$I_{E6} = I_{C6}\left(\frac{\beta_6 + 1}{\beta_6}\right) \quad (4)$$

$$= I_{E1}\left(\frac{\beta_6 + 1}{\beta_6}\right)$$

$$= I_{ref}\left(\frac{\beta_1 + 1}{\beta_1}\right)\left(\frac{\beta_6 + 1}{\beta_6}\right)$$

The voltage loop equation for the emitter circuits of $Q_6$ and $Q_7$ can be written as follows:

$$I_{E6}R_1 + V_{BE6} = V_{BE7} + I_{E7}R_3 \quad (5)$$

Rearranging terms yields:

$$I_{E7} = \frac{(V_{BE6} - V_{BE7})}{R_3} + \frac{R_1}{R_3}I_{E6} \quad (6)$$

Let:

$$\Delta V_{BE} = V_{BE6} - V_{BE7} \quad (7)$$

Therefore Equation (6) becomes:

$$I_{E7} = \frac{\Delta V_{BE}}{R_3} + \frac{R_1}{R_3}I_{E6} \quad (8)$$

Substituting the value of $I_{E6}$ from Equation (4) in Equation (8) yields:

$$I_{E7} = \frac{\Delta V_{BE}}{R_3} + \frac{R_1}{R_3}I_{ref}\left(\frac{\beta_6 + 1}{\beta_6}\right)\left(\frac{\beta_1 + 1}{\beta_1}\right) \quad (9)$$

But since $Q_1$ and $Q_6$ are matched $\beta_6=\beta_1=\beta$, and since $R_1=R_3$, we have:

$$I_{E7} = \frac{\Delta V_{BE}}{R_3} + I_{ref}\left(\frac{\beta + 1}{\beta}\right)^2 \quad (10)$$

By an analysis similar to that used in Equations (2) and (4), the value of $I_{C7}$ can be expressed as follows:

$$I_{C7} = \left(\frac{\beta_7}{\beta_7 + 1}\right)I_{E7} \quad (11)$$

$$= \left(\frac{\beta_7}{\beta_7 + 1}\right)\left[\frac{\Delta V_{BE}}{R_3} + I_{ref}\left(\frac{\beta + 1}{\beta}\right)^2\right]$$

But since $Q_7$ is also a matched transistor, Equation (11) becomes:

$$I_{C7} = \left(\frac{\beta}{\beta + 1}\right)\left[\frac{\Delta V_{BE}}{R_3} + I_{ref}\left(\frac{\beta + 1}{\beta}\right)^2\right] \quad (12)$$

As in Equation (1), $I_{C7}$ can be expressed as follows:

$$I_{C7}=I_{E9} \quad (13)$$

As in Equation (11), $I_0$ or $I_{C9}$ can be expressed as:

$$I_0 = I_{C9} = \left(\frac{\beta_9}{\beta_9 + 1}\right)I_{E9} \quad (14)$$

Since $Q_9$ is a matched transistor, Equation (14) can be simplified as follows:

$$I_0 = \left(\frac{\beta}{\beta + 1}\right)I_{E9} \quad (15)$$

Combining Equations (12), (13) and (15) yields:

$$I_0 = \left(\frac{\beta}{\beta + 1}\right)^2\left[\frac{\Delta V_{BE}}{R_3} + I_{ref}\left(\frac{\beta + 1}{\beta}\right)^2\right] \quad (16)$$

But since $Q_6$ and $Q_7$ are matched, their $V_{BE}$'s track with temperature causing $\Delta V_{BE}=0$. Equation (16) therefore becomes:

$$I_0 = I_{ref}\left(\frac{\beta}{\beta + 1}\right)^2\left(\frac{\beta + 1}{\beta}\right)^2 \quad (17)$$

Simplifying Equation (17) yields:

$$I_0 = I_{ref} \quad (18)$$

Equation (18) demonstrates that the output current $I_0$ selectively directed through the second current path is precisely equal to the steady state reference current $I_{ref}$ generated by current source 16. It is now clear that transistors $Q_1$-$Q_6$ couple the output current of a steady state or DC current source 16 to a switched output current path through current source transistor $Q_7$ and a current steering circuit formed by $Q_8$ and $Q_9$. As a result of the compensation provided by $Q_1$ and $Q_6$, the beta and $V_{BE}$ errors of $Q_7$ and the beta error of $Q_9$ have been completely eliminated as demonstrated by the mathematical analysis shown above. Those skilled in the art will recognize, after going through the above analysis that, if R1=R3 and if Q6 and Q7 are met, the $V_{BE}$ and the beta of Q7 is forced to be exactly the same as the $V_{BE}$ and beta of Q6, despite variations in temperature, and/or maufacturing process parameters and/or operating points on the $I_C$ versus $V_{CE}$ operating characteristics of Q6 and Q7. One skilled in the art will also recognize that, if Q9 and Q1 are matched, the beta of Q9 will be forced to be the same as the beta of Q1 and that therefore the base current $I_{B9}$ will be the same as $I_{B1}$ despite variations of beta due to temperature or manufacturing process variations or point on the $I_C$ versus $V_{CE}$ operating characteristic of Q9.

The digitally controlled precision current source of the present invention therefore selectively transfers a highly precise steady state current $I_{ref}$ to an output current path in a highly precise manner in response to a digital input signal.

Referring now to FIG. 4, the compensation circuit 10 discussed in connection with FIGS. 1 and 2 is shown coupled to the common base line of a plurality of current steered current sources which have been grounded together to form a digital to analog converter. In the particular embodiment depicted in FIG. 4, the digital to analog converter consists of equally weighted current sources in which the output current of each current source may be selectively steered into an R2R ladder attenuation network. Since all of the transistors depicted in the FIG. 4 circuit diagram are fabricated on a single monolithic substrate and are therefore matched, the compensating voltage produced by compensation circuit 10 between the base of Q6 and the negative power supply terminal $-V$ operates to properly compensate for the beta and $V_{BE}$ errors of each of the digital to analog converter current source transistors as well as for the beta error of the switching transistors utilized in the current steering circuits of the digital to analog converter.

In yet another embodiment of the present invention, the compensated output voltage of compensation circuit 10 may be coupled to the common base line of a digital to analog converter including individual current sources having binarily weighted output currents. For example, binarily weighted current sources may be grouped together in units of four, commonly referred to as quads, where each of the current sources within a single quad produce output currents having magnitudes in the ratio of 8, 4, 2, 1. In order to achieve maximum accuracy in a digital to analog converter of this type, a technique known as emitter scaling is utilized which produces uniform current density through the emitter of the transistors in each current source. FIG. 5 particularly depicts a digitally controlled precision current source in which output current $I_0$ is equal to four times the magnitude of the reference current generated by current source 16. In this configuration, the emitter load resistor of each parallel coupled current source Q7 is equal to the value of resistor $R_1$ which is coupled to the emitter of Q6.

Figure 6:
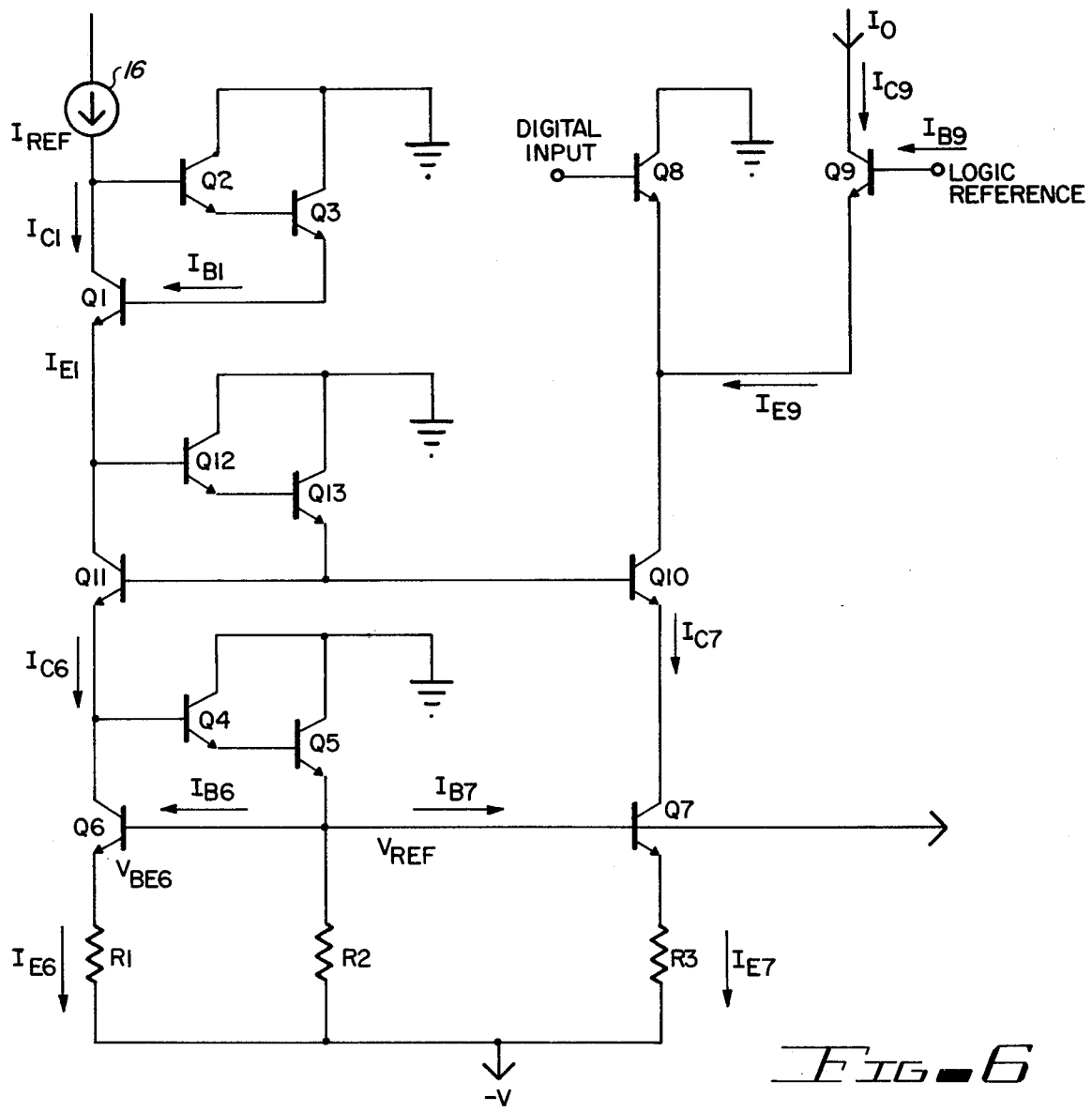
FIG. 6 is a schematic diagram illustrating a digitally controlled current source having a cascode current source stage to achieve improved transient isolation.

FIG. 6 depicts a cascode coupled version of the digitally controlled precision current source. In this embodiment, an additional current source transistor Q10 has been coupled between current source transistor Q7 and current steering transistors Q8 and Q9. In order to compensate for the errors created by cascode current source transistors Q10, an additional compensation stage formed by transistors Q11, Q12 and Q13 is inserted between the emitter of transistor Q1 and the collector transistor Q6. Additional cascode stages may be added as desired in a similar manner.

The cascode coupled configuration of the present invention depicted in FIG. 6 provides additional isolation between the output of current source transistor Q7 and the output of switching transistor Q9 in order to minimize switching transients. This particular configuration sacrifices a small degree of precision for a substantially enhanced transient isolation which may be highly desirable in certain applications.

It will be apparent to those skilled in the art that the disclosed digitally controlled precision current source may be modified in numerous other ways and may assume many embodiments other than the preferred forms specifically set out and described above. For example, the circuit may be readily modified to utilize PNP rather than the NPN transistors described above. Accordingly, it is intended by the appended claims to cover all such modifications of the invention which fall within the true spirit and scope of the invention.

I claim:

1. A digitally controlled temperature compensated current source for generating a precision output current steerable through either a first or a second current path in response to a digital input signal, comprising:

a. current source means for generating a substantially constant output current and including a current source transistor and a first resistor connected between the emitter of said current source transistor and a voltage source conductor;

b. current steering means coupled to said current source means for steering said output current through either the first or the second current paths in response to the digital input signal and including a switching transistor having an emitter coupled to the collector of said current source transistor and a collector coupled to said current path; and c. compensation means coupled to said current source means and including:

i. reference circuit means for generating a steady state precision reference current;

ii. first compensation circuit means including a first transistor having a collector coupled to receive the reference current for generating a first compensated output current to correct for the beta error of said switching transistor, said first compensation circuit means including a second transistor having its base connected to the collector of said first transistor, and having its emitter connected to the base of a third transistor, said third transistor having its emitter connected to the base of said first transistor, the collectors of said second and third transistors being connected to bias said second and third transistors in their linear regions;

iii. second compensation circuit means including a fourth transistor having a collector coupled to receive the first compensated output current, a base coupled to the base of said current source transistor, and an emitter coupled to said voltage source for correcting for the beta error and base to emitter voltage error of said current source transistor, said second compensation circuit means including a fifth transistor having its base connected to the emitter of said first transistor and having its emitter connected to the base of a sixth transistor, said sixth transistor having its emitter connected to the base of said fourth transistor, the collectors of said fifth and sixth transistors being coupled to bias said fifth and sixth transistors in their linear regions;

iv. a second resistor connected between the emitter of said fourth transistor and said voltage source conductor; and said second compensation circuit means functioning to maintain the beta and base to emitter voltage of said fourth transistor equal, respectively, to the beta and base to emitter voltage of said current source transistor, said first compensation circuit means functioning to maintain the beta of said switching transistor equal to the beta of said first transistor.

2. The digitally controlled temperature compensated current source of claim 1 wherein said current steering means further includes a seventh transistor for receiving the digital input signal and for interfacing the digital input signal with said switching transistor, the emitter of said seventh transistor being connected to the emitter of said switching transistor, and the base of said seventh transistor is coupled to receive said digital input signal, and the collector of said seventh transistor is coupled in series with said first current path, wherein the base of said switching transistor is coupled to a reference voltage conductor and the collector of said switching transistor is coupled in series with said second current path.

3. The digitally controlled temperature compensated current source of claim 2 wherein the resistance of said first resistor is equal to the resistance of said second resistor.

4. The digitally controlled temperature compensated current source of claim 3 wherein the precision output current is equal to the reference current.

5. The digitally controlled temperature compensated current source of claim 2 wherein the resistance of said second resistor is equal to a multiple of the resistance of said first resistor.

6. The digitally controlled temperature compensated current source of claim 5 wherein said precision output current is equal to a multiple of said reference current.

7. A temperature compensated digital to analog converter for generating a precision analog output signal in response to a digital input signal, comprising:
 a. current source means for generating a substantially constant output current and including a current source transistor and a first resistor connected between the emitter of said current source transistor and a voltage source conductor;
 b. first current steering means coupled to said current source means for steering said output current through either first or second current paths in response to the digital input signal and including a switching transistor having an emitter coupled to the collector of said current source transistor and a collector coupled to said second current path; and
 c. compensation means coupled to said current source means and including:
  i. reference circuit means for generating a steady state precision reference current;
  ii. first compensation circuit means including a first transistor having a collector coupled to receive the reference current for generating a first compensated output current to correct for the beta error of said switching transistor, said first compensation circuit means including a second transistor having its base connected to the collector of said first transistor and having its emitter connected to the base of a third transistor, said third transistor having its emitter connected to the base of said first transistor, the collectors of said second and third transistors being connected to bias said second and third transistors in their linear regions;
  iii. second compensation circuit means including a fourth transistor having a collector coupled to receive the first compensated output current, a base coupled to the base of said current source transistor, and an emitter coupled to said voltage source for correcting for the beta error and base to emitter voltage error of said current source transistor, said second compensation circuit means including a fifth transistor having its base connected to the emitter of said first transistor and having its emitter connected to the base of a sixth transistor, said sixth transistor having its emitter connected to the base of said fourth transistor, the collector of said fifth and sixth transistor being coupled to bias said fifth and sixth transistors in their linear regions;
  iv. a second resistor connected between the emitter of said fourth transistor and said voltage source conductor;

said second compensation circuit means functioning to maintain the beta and base to emitter voltage of said fourth transistor equal, respectively, to the beta and base to emitter voltage of said current source transistor, said first compensation circuit means functioning to maintain the beta of said switching transistor equal to the beta of said first transistor, said temperature compensated digital to analog converter including a plurality of additional current steering means substantially similar to said first current steering means, and each including a switching transistor, the base of which is connected to the base of said fourth transistor, each of said additional current steering means being connected to separate current source means that is substantially similar to the current source means of element (a).

* * * * *